(12) United States Patent
Alwan et al.

(10) Patent No.: US 6,174,449 B1
(45) Date of Patent: Jan. 16, 2001

(54) MAGNETICALLY PATTERNED ETCH MASK (75) Inventors: James J. Alwan, Boise; Eric Knappenberger, Meridian, both of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/079,252

(22) Filed: May 14, 1998

(51) Int. Cl.⁷ .................................................. G03G 19/00
(52) U.S. Cl. ............................................. 216/42; 427/547
(58) Field of Search ................................ 216/12, 22, 42; 427/547; 430/39

(56) References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25 |
| 3,814,968 | 6/1974 | Nathanson et al. | 313/95 |
| 3,850,627 * | 11/1974 | Wells et al. | 96/1.3 |
| 3,894,332 | 7/1975 | Nathanson et al. | 29/578 |
| 3,970,887 | 7/1976 | Smith et al. | 313/309 |
| 4,196,041 | 4/1980 | Baghdadi et al. | 156/620 |
| 4,407,695 | 10/1983 | Deckman et al | 156/643 |
| 4,513,308 | 4/1985 | Greene et al. | 357/55 |
| 4,644,101 | 2/1987 | Jim et al. | 178/18 |
| 4,685,996 | 8/1987 | Busta et al. | 156/628 |
| 4,737,112 | 4/1988 | Jin et al. | 439/66 |
| 4,806,202 | 2/1989 | Tang et al. | 156/657 |
| 4,857,161 | 8/1989 | Borel et al. | 204/192 |
| 4,857,799 | 8/1989 | Spindt et al. | 313/495 |
| 4,874,981 | 10/1989 | Spindt | 313/309 |
| 4,923,739 | 5/1990 | Jin et al. | 428/221 |
| 4,940,916 | 7/1990 | Borel et al. | 313/306 |
| 4,964,946 | 10/1990 | Gray et al. | 156/643 |
| 4,968,382 | 11/1990 | Jacobson et al. | 156/643 |
| 4,992,699 | 2/1991 | McClure et al. | 313/525 |
| 4,997,780 | 3/1991 | Szluk et al. | 437/41 |
| 5,015,912 | 5/1991 | Spindt et al. | 313/495 |
| 5,063,327 | 11/1991 | Brodie et al. | 313/482 |
| 5,063,396 | 11/1991 | Spindt | 445/50 |
| 5,075,591 | 12/1991 | Holmberg | 313/495 |
| 5,083,958 | 1/1992 | Longo et al. | 445/24 |
| 5,132,058 | 7/1992 | Suyama et al. | 264/24 |
| 5,140,219 | 8/1992 | Kane | 313/495 |
| 5,151,061 | 9/1992 | Sandhu | 445/24 |
| 5,157,304 | 10/1992 | Kane et al. | 313/495 |
| 5,180,888 | 1/1993 | Sugiyama et al. | 174/94 |
| 5,186,670 | 2/1993 | Doan et al. | 445/24 |
| 5,200,238 | 4/1993 | McArdle et al. | 428/1 |
| 5,201,992 | 4/1993 | Marcus et al. | 156/643 |
| 5,217,401 | 6/1993 | Watanbe | 445/24 |
| 5,220,725 | 6/1993 | Chan et al. | 29/874 |

(List continued on next page.)

FOREIGN PATENT DOCUMENTS

| | | | |
|---|---|---|---|
| 0 379 298 A2 | 10/1990 | (EP) . | |
| WO 91/15874 | 10/1991 | (EP) . | |
| 0 757 407 A1 | 7/1996 | (EP) . | |
| WO 94/28569 | 12/1994 | (FR) . | |
| 57043412 | 3/1982 | (JP) | 156/628.1 |
| 3238729 | 10/1991 | (JP) | 445/50 |

OTHER PUBLICATIONS

"Liquid Crystal Display Products", Product Brochure, Standish LCD, Division of Standish Industries Inc., pp. 5–6, Sep. 1993.

(List continued on next page.)

(57) ABSTRACT

A method for forming an etch mask is described. In particular, an etch mask is formed using masking particles positionally restrained by a matrix medium. Either the masking particles or the matrix medium is more magnetically conductive with respect to the other. A magnetic field is applied for making a random distribution of the masking particles less random. Consequently, agglomeration of the masking particles is reduced. Masking particles with submicron dimensions may be used for providing features of less than a micron. The mask formed may be an etch mask employed in forming a field emitter tip for a field emission display.

37 Claims, 7 Drawing Sheets

U.S. PATENT DOCUMENTS

| | | | |
|---|---|---|---|
| 5,221,221 | 6/1993 | Okaniwa | 445/24 |
| 5,228,877 | 7/1993 | Allaway et al. | 445/24 |
| 5,229,171 | 7/1993 | Donovan et al. | 427/483 |
| 5,229,331 | 7/1993 | Doan et al. | 437/228 |
| 5,232,549 | 8/1993 | Cathey et al. | 456/633 |
| 5,249,732 | 10/1993 | Thomas | 228/179 |
| 5,266,530 | 11/1993 | Bagley et al. | 437/228 |
| 5,267,884 | 12/1993 | Hosogi | 445/24 |
| 5,275,693 | 1/1994 | Nakama | 156/644 |
| 5,277,638 | 1/1994 | Lee | 445/24 |
| 5,302,238 | 4/1994 | Roe et al. | 156/643 |
| 5,312,514 | 5/1994 | Kumar | 156/643 |
| 5,316,857 | 5/1994 | Spiegel | 428/457 |
| 5,324,603 | 6/1994 | Jin et al. | 430/39 |
| 5,334,330 | 8/1994 | Rowlette | 252/512 |
| 5,358,908 | 10/1994 | Reinberg et al. | 437/228 |
| 5,391,259 | 2/1995 | Cathey et al. | 156/643 |
| 5,399,238 | 3/1995 | Kumar | 156/643 |
| 5,424,605 | 6/1995 | Lovoi | 313/422 |
| 5,443,876 | 8/1995 | Koskenmaki et al. | 428/40 |
| 5,510,156 | 4/1996 | Zhao | 427/534 |
| 5,522,962 | 6/1996 | Koskenmaki et al. | 156/272.4 |
| 5,588,894 | * 12/1996 | Jin et al. | 445/24 |
| 5,676,853 | 10/1997 | Alwan | 216/11 |
| 5,695,658 | 12/1997 | Alwan | 216/42 |

OTHER PUBLICATIONS

"Process–Stabilized Extrude Bonding Wire and Ribbon", Product Brochure, Hydrostatics Inc., Bethlehem PA. (Jun. 1991).

Konhoh, You et al. "A Subminiature CCD Module Using a New Assembly Technique"IEICE Transactions. vol. E74, No. 8. Aug. 1991.

Cohen, I.M. et al. "Ball Formation Process in Aluminum Bonding Wire", Solid State Technology, pp. 89–92, Dec. 1985.

Levy, F. et al. "Phosphors for Full Color Microtips Fluorescent Displays", pp. 20–23, IEEE, Aug. 1991.

Kang, Sa–Yoon et al. Physical and Fuzzy Logic Modeling of a Flip–Chip Thermocompression Bonding Process, Journal of Electronic Packaging, pp. 63–70, Mar. 1993.

Marcus et al., "Formation of Silicon Tips with 1 nm Radius", Appl. Physics Letter, vol. 56 No. 3, Jan. 15, 1990.

Hunt et al., "Structure and Electrical Characteristics of Silicon Field–Emission Microelectronic Devices", IEEE Transaction on Electron Devices, vol. 38, No. 10, Oct. 1991.

McGruer et al., "Oxidation–Sharpened Gated Field Emitter Array Process", IEEE Transactions on Electron Devices, vol. 38, No. 10, Oct. 1991.

R. Z. Bakhitizin, S.S. Ghots, and E. K. Ratnikova, "GaAs Field Emitter Arrays", *IEEE Transactions On Electron Devices*, vol. #8, No. 10, Oct. 1991, pp. 2398–2400.

R.N. Thomas, R.A. Wickstrom, D.K. Schroder, and H.C. Nathanson, "Fabrication and Some Appplications Of Large–Area Silicon Field Emission Arrays", *Solid–State Electronics*, vol. 17, Feb. 1974, pp. 155–163.

Kim et al., "Generation of Charged Liquid Cluster Beam of Liquid Mix Precursors and Application to Nanostructured Material", Nanostructured Materials, vol. 4, No. 5, pp. 597–602, May 1994.

Marcus et al., "Atomatically Sharp Silicon and Metal Field Emitters", IEEE Transactions on Electron Devices, Oct. 1991, vol. 38, No. 10, pp. 2309–2313.

S. D. Brotherton, Poly–crystalline Silicon Thin Film Devices for Large Area Electronics, Microelectronic Engineering 15, Mar. 1991, pp. 333–340.

Madeleine Bonnel, Nichole Duhamel, Mohamed Guendouz, Lazhar Hiji, Bertand Loisel and Patrick Rualt, "Poly–Si Thin Film Transistors Fabricated with Rapid Thermal; Annealed Silicon Films", Japanese Journal of Applied Physics, Nov., 1991, pp. L1924–L1926.

Satoshi Takenake, Masafumi, Masafumi Kunii, Hideali Oka and Hajime Kurihara, "High Mobility Poly–Si TFTs Using Solid Phase Crystallized a Si Films Deposited by Plasma Enhanced Chemical Vapor Deposition", Extended Abstracts of the $22^{nd}$ Sep. 1990 Internation Conference on Solid State Devics and Materials, Sendai.

Solid–State Electronics vol. 34, No. 7, 671–679, Jul. 1991, "Characterization of Low Temperature Poly–Si Thin Film Transistors", pp. 671–679.

Hiroshi Kanoh, Osamu Sugiura, Paul A. Breddels and Masakiyo Matsumura, "Optimization of Chemical Vapor Deposition Conditions of Amorphous–Silicon Films for Thin–Film Transistor Application", Japanese Journal of Applied Physics, Nov., 1990, pp. 2358–2364.

Thomas W. Little, Ken–ichi Takahara, Hideki Koike, Takashi Nakazawa, Ichio Yudasaka and Hiroyuki Ohshima, "Low Temperture Poly–Si TFTs Using Solid Phase Crystallization of Very Thin Films and an Electron Cyclotron Resonance Chemical Vapor Deposition Gate Insulators", Japanese Journal, Dec. 1991.

Fei Luo, Gerold W. Neudeck and Shengwen Luan, "Simulation of the Turn–On Transient Behavior of Amorphous–Silicon Thin–Film Transistors", Solid–State Electronics, Nov. 1991, pp. 1289–1295.

Uday Mitra, Barbara Rossi, and Babar Khan, "Mechanism of Plasma Hydrogenation of Polysilicon Thin–Film Transistors", Solid State Electronics, Nov. 1991, pp. 1289–1295.

"Poly Si Thin Film Transistors Fabricated with Rapid Thermal Annealed Silicon–Films", Japanese Journal of Applied Physics, Nov., 1991, pp. L1924–L1926.

"12.3: New Microlithography Technique for Large Size Field Emission Displays", LETI–CEA Grenoble, 17 rue des Martyrs 38054, France, Aug. 1996.

Montgomery, Clive Richard, "Flip Chip Assemblies Using Conventional Wire Bonding Apparatus and Commercially available Dies," ISHM '93 Jul. 1993 Proceedings, pp. 451–456.

IBM Technical Disclosure, "Direct Chip Bonding for Liquid Crystal Display", vol. 34, No. 5, Oct. 1991, pp. 193–184.

"Characteristic of Low Temperature Poly–Si Thin Film Trnasistors" Solid–State Electronics vol. 34, No. 7, pp. 671–679, Jul. 1991.

Journal of Electronics Manufacturing (1993) 3, 85–94, "The effects of conducting particle distribution on the behavior of anisotropic conducting adhesives: non–uniform conductivity and shorting between connections"., Mar., 1993.

Euro Display '96, "High Resolution Anisotropically Conductive Ferroadhesives Suitable for Chip–on Glass and Flexible Circuit Interconnection." Sep. 1996.

"Anisotropically Conductive Polymer Films with a Uniform Dispersion of Particles", IEEE Transactions on Components, Hybrids, and Manufacturing Technology, vol. 16, No. 8, Dec. 1993.

IEEE Transactions on Electron Devices, vol. 36, No. 11, Nov. 1989, "Wet Etching of Cusp Structures for Field–Emission Devices", pp. 2709–2714.

Technical Digest of IVMC 91, Nagaharna 1991, "Fabrication and Characteristics of Si Field Emitter Arrays". pp. 26–29., Jan. 1991.

"GaAs Field Emitter Arrays", IEEE Transactions on Electron Devices, vol. 38, No. 10, Oct. 1991, pp. 2398–2400.

IEEE Transactions on Electron Devices, Oct. 1991, vol. 38, No. 10, "Atomically Sharp Silicon And Metal Field Emitters", pp. 2289–2293.

"Atomic layer growth of $SiO_2$ on $SiCl_4$ and $H_2O$ in a binary reaction sequence" pp. 135–152, 1995 Elsevier Science 334., Jan. 1995.

"Ferromagnetic Materials Structure and Properties" Micron Display by R.A. McCurrie, pp. 117–121., Mar. 1997.

Eurodisplay 1996. "New Microlithography Technical for Large Size Field Emission Displays" Paper 033., Sep. 1996.

* cited by examiner

*Primary Examiner*—Randy Gulakowski
*Assistant Examiner*—Allan Olsen
(74) *Attorney, Agent, or Firm*—Schwegman, Lundberg, Woessner & Kluth-

MAGNETICALLY PATTERNED ETCH MASK

TECHNICAL FIELD OF THE INVENTION

The present invention relates generally to etch masks and their formation, and more particularly to etch masks for formation of emitter tips for field emission displays.

BACKGROUND OF THE INVENTION

In the microelectronics industry, there is a movement toward creating flat panel displays. These displays have the advantage of being significantly more compact than cathode ray tube displays, e.g., conventional computer monitors. There are different types of flat panel displays, such as liquid crystal displays ("LCDs"), gas-plasma displays, thin film transistor ("TFT") displays, and field emission displays ("FEDs"). FEDs are particularly well-suited to applications requiring high resolution, low power, wide viewing angle, and environmental robustness.

FEDs are able to achieve high resolution owing in part to the presence of a significant number of emitter tips concentrated in a small space. These emitter tips, or cold cathode field emitter tips, and their formation are described in U.S. Pat. Nos. 5,391,259, 5,358,908, 5,151,061, among others.

Owing to recent advancements in photolithography and microlithography (hereinafter collectively referred to as "lithography"), many emitter tips may be formed within a given area, which allows for increased resolution capabilities of FEDs.

However, this increased resolution is not without a price. Lithography, especially at or below a one micron topographic structure dimension, requires expensive equipment and process steps. These steps often include using a reticle or pattern to form a patterned mask layer on a substrate. This patterning is conventionally achieved by exposing the reticle to energy to transfer a reticle image onto layer of resist on the substrate. Owing to the costly nature of the above-described "resist formed mask" step, it would be desirable to avoid it.

One approach to avoid a resist mask step is found in U.S. Pat. No. 4,407,695 entitled "Natural Lithographic Fabrication of Microstructures Over Large Areas" to Deckman et al. ("Deckman et al. '695"). Deckman et al. '695 describes forming a mask by depositing a monolayer of colloidal particles on a substrate. The particles may be arranged in the monolayer as an array. The array serves as a lithographic mask for etching the substrate. As the balls or particles are packed together, they form emitter tips in the substrate when etched. However, gaps between particles may not always be uniform, so resulting emitter tips will not be uniform.

Another approach to avoid a resist mask step for forming field emitter tips is found in U.S. Pat. No. 5,399,238 entitled "Method of Making Field Emission Tips Using Physical Vapor Deposition of Random Nuclei As Etch Mask" to Kumar ("Kumar '238). Kumar '238 describes vapor deposition of randomly located, discrete nuclei. The nuclei are deposited on a emitter tip material, and form a discontinuous etch mask thereon. Using an ion etch, the emitter tips are formed with aid of the nuclei etch mask. However, such deposition does not preclude agglomeration of nuclei, and so resulting emitter tips will not be uniform.

Therefore, it would be desirable to provide a method of non-lithographically forming an etch mask, which does not produce significant non-uniformity in the subsequent formation of emitter tips.

SUMMARY OF THE INVENTION

The present invention includes processes for forming an etch mask, and is particularly suited for use in defining field emission tips for a field emission display. In such a process, a plurality of masking objects in combination with a matrix medium are disposed on a substrate assembly. The matrix medium facilitates maintaining the masking objects on the substrate assembly, as well as reducing unwanted movement of the masking objects with respect to one another. In other words, movement of the masking objects is restricted by a matrix medium. Moreover, the masking objects may sink in, be suspended in, or float on the matrix medium. The masking objects and the matrix medium are then subjected to a magnetic field. The magnetic field causes agglomeration or clustering of the masking objects to be reduced. This reduction in clustering facilitates forming a discrete structure under each masking object, and in particular, forming discrete emitter tips for a field emission display. Importantly, the above-described process of forming a mask may be done in a non-lithographic manner. By non-lithographic it is meant that masking objects are dispensed on a substrate assembly and moved about thereon without any microlithographic and/or photolithographic step.

BRIEF DESCRIPTION OF THE DRAWING(S)

Features and advantages of the present invention may be more readily understood by reference to the appended claims, detailed description of particular embodiment(s) and accompanying drawings where:

Reference numbers refer to the same or equivalent parts of the present invention throughout the several figures of the drawings.

DETAILED DESCRIPTION OF THE PREFERRED EMBODIMENT(S)

The present invention is described in terms of the formation of one or more emitter tips for an FED. However, it should be understood that a mask in accordance with the present invention may be employed in the formation of structures other than emitter tips. Such structures or features include all those which may be formed by an etch step using an etch mask.

Figure 1:
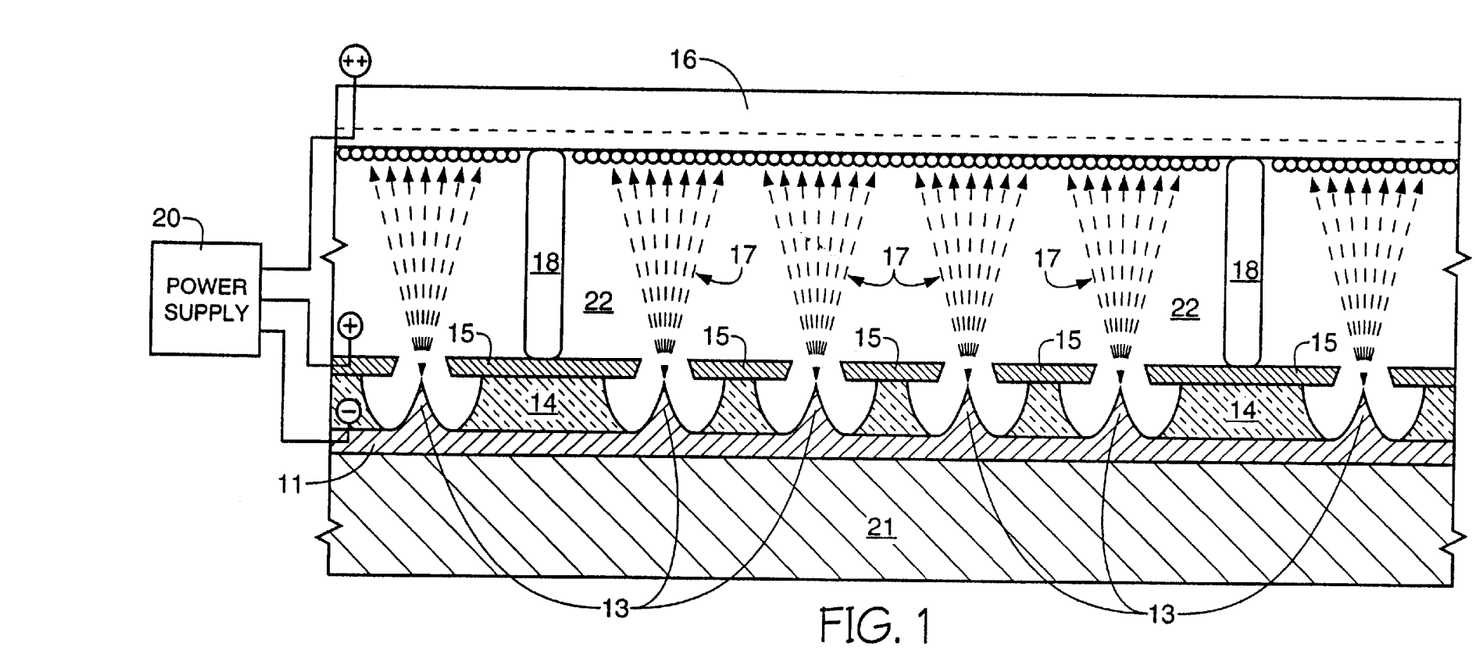
FIG. 1 is a cross-sectional view of an exemplary portion of an FED having an array of emitter tips formed in accordance with the present invention.

Referring to FIG. 1, there is shown a cross-sectional view of an exemplary portion of FED 10 having an array of emitter tips 13 formed in accordance with the present invention. As the present invention is described in terms of forming emitter tip(s) 13, an understanding of the basic components of FED 10 is desirable. FED 10 starts with baseplate 21. Conventionally, baseplate 21 may be made of glass coated with an electrical conductor, or be made integral with layer 11. Formed on baseplate 21 is emitter material layer 11. Layer 11, for example, may be made of single crystal silicon, a polycrystalline silicon, or an amorphous silicon, which is doped for conductivity.

A dielectric layer 14 is formed on layer 11. Dielectric layer 14 (e.g., an oxide layer) insulates gate or extraction grid 15 from tips 13 of layer 11. This allows a potential difference from source 20 to be applied between grid 15 and array of tips 13. Posts 18 aid in defining and maintaining volume 22 between face plate 16 and emitter tips 13. Volume 22 is evacuated in order to facilitate electron projection 17 from emitter tips 13 to phosphors 19 while in vacuum. Electrons are accelerated owing to a difference in potential from source 20 as applied between face plate 16 and emitter tips 13. Additional conventional details with regard to FED 10 have been omitted in order to more clearly describe the present invention.

Figure 2:
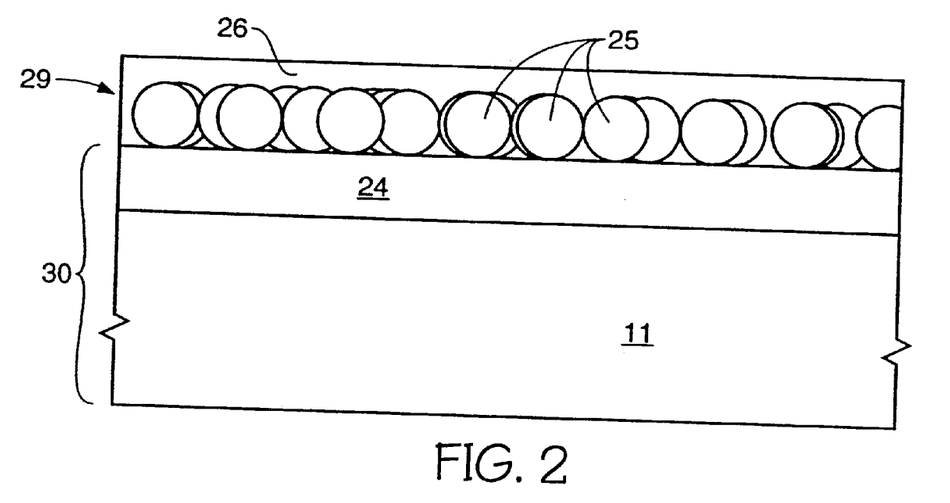
FIG. 2 is a cross-sectional view of a mask layer and a substrate assembly in accordance with the present invention.

Referring to FIG. 2, there is shown a cross-sectional view of mask layer 29 and substrate assembly 30 in accordance with the present invention. Substrate assembly 30 may include one or more layers, at least one of which may be a wafer or base member of a semiconductive material such as single crystalline silicon. Mask layer 29 of FIG. 2 may be more clearly seen in the top view thereof as shown in FIG. 3.

Figure 3:
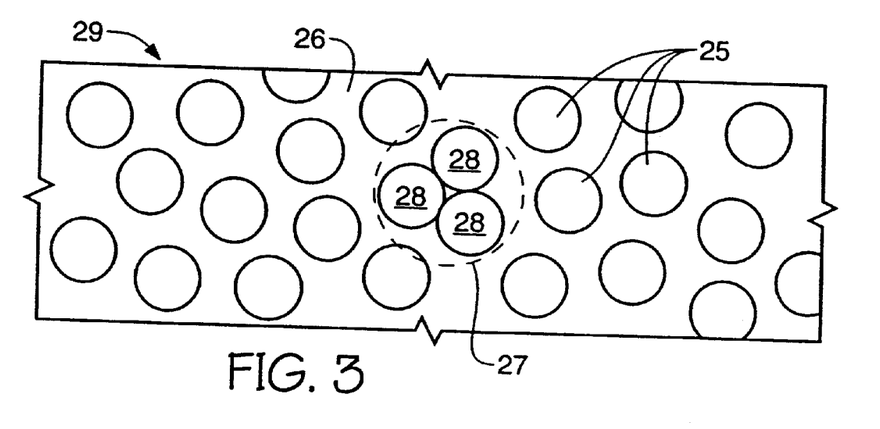
FIG. 3 is a top elevation view of the mask layer of FIG. 2.

Referring to FIGS. 2 and 3 in combination, mask layer 24 has been formed on or applied to an exposed upper surface of emitter material layer 11. Mask layer 24 may be a hard mask layer, such as a nitride layer. Located on or above mask layer 24 is objects layer 29 comprised of randomly distributed masking objects 25. There are several manners in which objects layer 29 may be formed onto or above layer 24. Objects layer 29 may be deposited, sprayed, spun, spread, dip-coated, evaporated, or in like manner formed on mask layer 24. In particular, masking objects 25 may be droplets dispensed onto a surface of layer 24. Such droplets may be cured during dispensing or after forming on layer 24.

Etch mask layer 29 is composed at least in part of masking objects 25. Masking objects 25 may include particles, microballs, droplets, beads, and the like. Masking objects may be any of a variety of shapes including but not limited to spherical, rod-shaped, oval-shaped, polygonal, irregularly shaped, and the like. It is currently contemplated that particle size will preferably be in a range of approximately 0.1 to 500 micrometers (microns) in any given dimension; however, larger and smaller particle dimensions may be employed. Matrix material 26 may also be included as part of layer 29. Masking objects 25 may be difficult to move, so matrix material 26 may be added to facilitate use of a relatively weaker magnetic field for moving objects 25.

Masking objects 25 may be relatively more or less magnetically conductive (permeable) with respect to matrix material 26. Materials which may be used for matrix material 26 include that which can be cured from a liquid state to a gelatinous, polymer, or solid state. Matrix material 26 may be an elastomer, adhesive, thermoplastic, or glass. Matrix material 26 may be water, resist (e.g., polymer-based, wavelength sensitive material), or a polymeric material such silicone rubber, epoxies, resins, polyurethanes, and the like. A material may be used to dilute the matrix material, such as methyl-ethyl-ketone to dilute silicone rubber, or a solvent or water for a like based thermoplastic resin. Ferromagnetic adhesive liquids may be employed for matrix material 26. Ferromagnetic adhesives and like materials may be provided by subjecting magnetic resins to a magnetic field. When the magnetic monomers and/or resins reach saturation, ferrofluidic material results.

Ferromagnetic particles may be used for masking objects 25. Masking objects 25 may be made or composed of materials such as iron, nickel, cobalt, or a ferrite. Materials such as silver and gold, as well as metal-coated non-magnetic (e.g., polymer) beads, may also be used. Moreover, alloys comprising either iron, nickel, cobalt, or a ferrite material may be used, including iron-nickel permalloys. Masking objects 25 may be composed of polystyrene, silica, latex, and the like. Masking objects 25 may be a combination of magnetically and less magnetically permeable materials, such as polymer coated ferrite particles (e.g., magnetite —$Fe_2O_3$ or hematite encased in polystyrene).

Masking objects 25 may be located on substrate assembly 30 prior to application of matrix material 26. Alternatively, masking objects 25 may be mixed with matrix material 26 prior to or contemporaneously with application to substrate assembly 30. Matrix material 26 may be located on substrate assembly 30 prior to or contemporaneously with locating masking objects 25 on substrate assembly 30.

Matrix material 26 may facilitate moving objects 25 on substrate assembly 30 in combination with the application of a magnetic field. However, depending on the material employed for objects 25, such objects 25 may be positionally maintained in desired positions owing at least in part to the viscosity and/or curing of material 26.

For purposes of making tip 13, it is preferred that a monolayer of masking objects 25 be deposited; however, masking objects 25 may be stacked on top of one another as well for forming an etch mask 29. For a monolayer of masking objects 25, as illustrative in FIG. 3, a random or non-patterned distribution or dispersion of objects 25 is applied to layer 24. As indicated in dashed circle 27, a plurality of objects 28 may be clumped on or otherwise undesirably in contact with one another owing to this random distribution. This contacting of two or more objects is referred to as agglomeration or clustering. The present invention is directed in part at reducing the probability of agglomeration.

Figure 4:
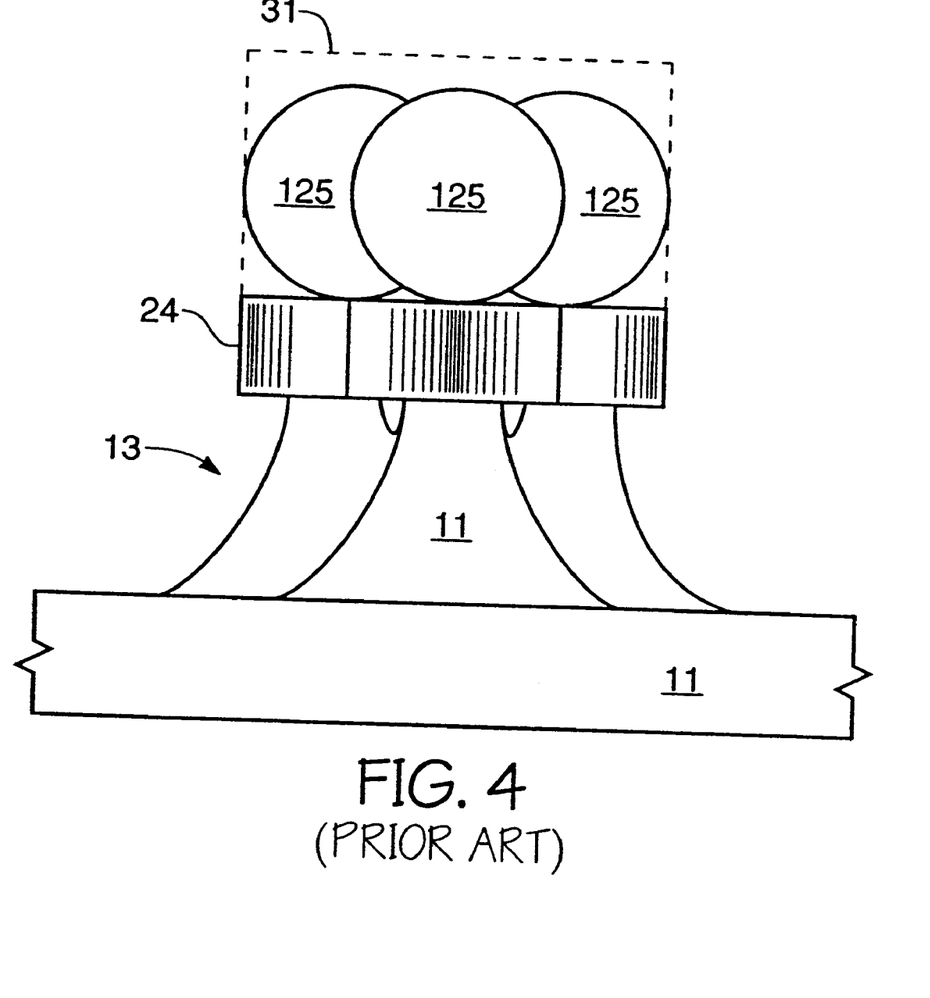
FIG. 4 is a cross-sectional view of an exemplary portion of a substrate assembly having an emitter material layer etched to form emitter tips from an agglomeration of masking objects.

Referring to FIG. 4, to better understand the effects of agglomeration on tip 13 formation, there is shown a cross-sectional view of an exemplary portion of substrate assembly 30 having layer 11 etched to form tips 13 from an agglomeration 31 of objects 125 of the prior art. As illustratively shown, agglomeration 31 of masking objects 125 causes a plurality of tips 13 to be formed contiguously with respect to one another. Consequently, a distinct sharp tip 13 cannot be formed. This results in a failed portion of a pixel emitter array.

Figure 5:
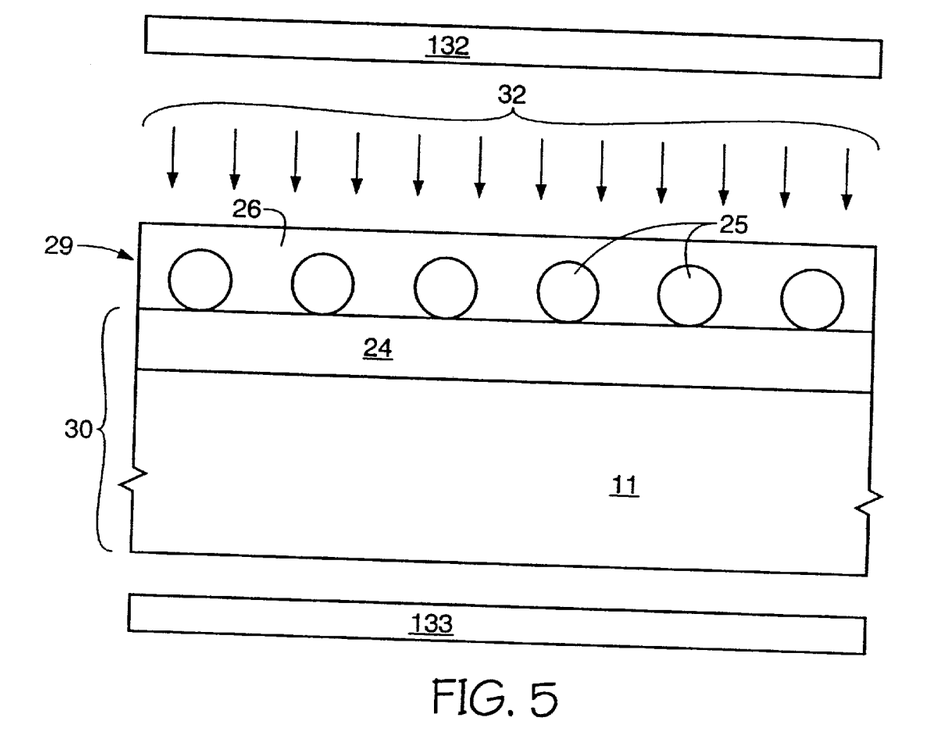
FIG. 5 is a cross-sectional view of a substrate assembly and an etch mask after magnetic alignment in accordance with the present invention.

Referring to FIG. 5, there is shown a cross-sectional view of substrate assembly 30 and etch mask 29 in accordance with the present invention. Masking objects 25 are illustratively shown with an exaggerated uniformity in order to more clearly describe the present invention. However, it should be understood that the present invention is directed at least in part at reducing the probability of agglomeration, and as such, a completely uniform distribution of masking objects, although desirable, is not required for practicing the present invention.

As shown in FIG. 5, magnetic field 32 has been applied to etch mask 29 for moving and thus better aligning masking objects 25. Field 32 may be applied such that all magnetic pole orientations for each particle are the same. For example, all magnetic south poles of masking objects 25 may be oriented in a downward direction toward hard mask layer 24. This will result in lateral repulsion between masking objects 25. Alternatively, masking objects 25 may be induced to take on a magnetic moment by application of field 32. In either case, objects 25 take on a more uniform dispersion or distribution owing to application of magnetic field 32, resulting in less probability for agglomeration.

Figure 6:
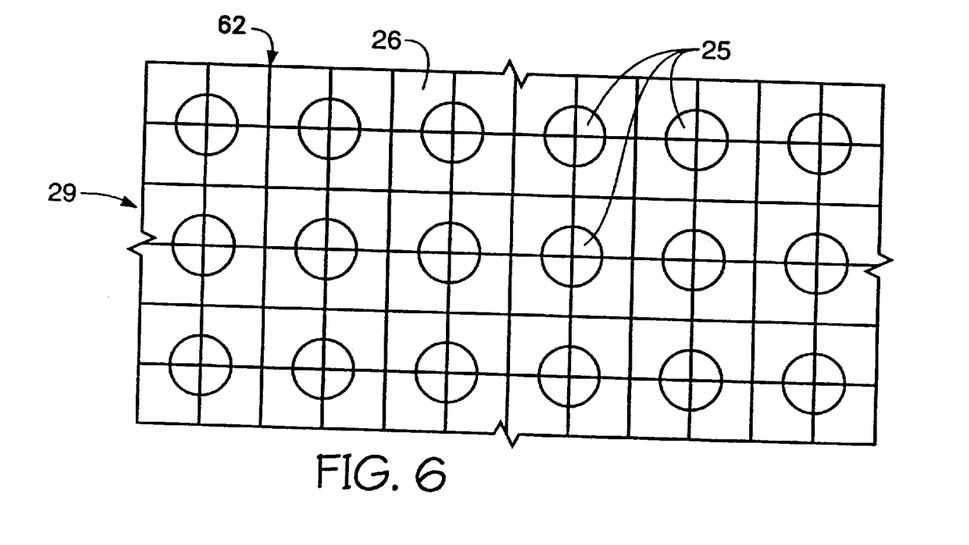
FIG. 6 is a top elevation view of an etch mask using a grid for magnetic alignment in accordance with the present invention.

Referring to FIG. 6, there is shown a top elevation view of etch mask 29 in accordance with the present invention. A blanket magnetic field 32 may be applied for orienting masking objects 25. In another embodiment, grid 62 may be placed over etched mask 29 for applying magnetic field 32 thereto.

Magnetic field 32 may be of a magnitude in a range of approximately 100 to 1000 oersteds (Oe). Field 32 may be supplied by either by permanent magnets or electromagnets. For example, magnets 132 and 133 may be permanent magnets or may be electromagnets configured to form a Hemholtz coil. Moreover, one or more direction-gradient magnetic fields may be employed to provide field 32 to facilitate particle separation and movement. The required or desired magnitude of field 32 is dependent on material and processing parameters, such as surface tension and viscosity of matrix material 26, size, specific gravity and magnetic susceptibility of masking objects 25.

It should be understood that there are many possible combinations of masking objects 25 and matrix materials 26. One combination may be a liquid (generally having a water, an oil, or a combination of oils base) having colloidal iron (e.g., $Fe_2O_3$, $Fe_3O_4$, and Co) particles suspended in it. For magnetite encased with polystyrene, generally spherical particles of about 1.6 microns in diameter may be redistributed with a permanent magnet of sufficient strength. The particles may be coupled to the liquid by use of a stabilizing agent such as oleic acid. Depth of the matrix material may be about one to two times the maximum height dimension of the particles prior to alignment, as any thicker than that may introduce agglomeration and any thinner than that may make redistribution problematic owing to frictional forces between masking particles 25 and platform layer 24.

Figure 7:
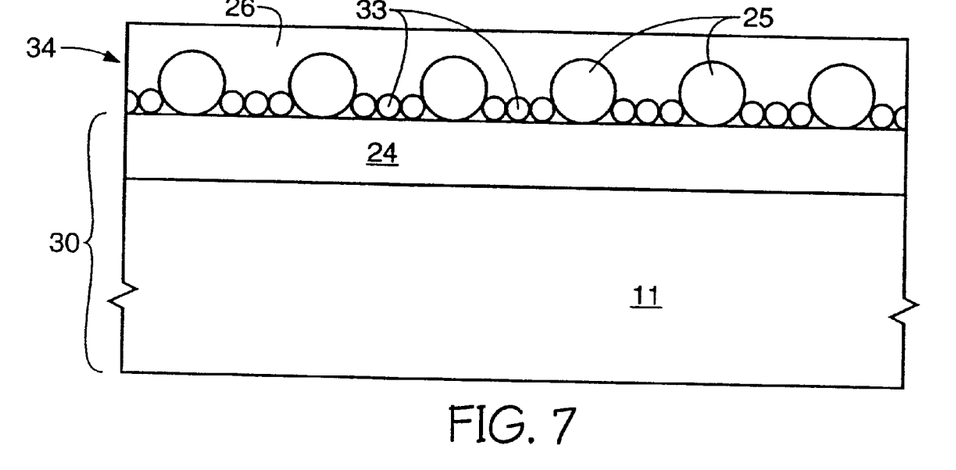
FIG. 7 is a cross-sectional view of a substrate assembly and a mask layer having spacer objects in accordance with the present invention.

Referring to FIG. 7, there is shown a cross-sectional view of substrate assembly 30 and mask layer 34 in accordance with the present invention. Mask layer 34 is made of differing sizes of objects, namely, masking objects 25 and spacer objects 33. Objects 25 may be different sizes themselves. However, for a field emission display, uniform brightness is desirable, which is dependent at least in part on emitter tip shape and density. Thus, it is important both to reduce clustering of tips, and to make all emitter tips of substantially the same size and shape to facilitate uniform brightness. Consequently, it is desirable to make objects 25 of similar or same physical dimensions.

Spacer objects 33 may be any of a variety of smaller particles which are not significantly magnetically conductive with respect to objects 25, and which may be selectively removed with respect to objects 25. Such objects 33 create interstices to facilitate a reduction in the likelihood of agglomeration of objects 25.

Referring to FIGS. 5–7, magnetic field 32 may be applied during and/or after dispensing of masking objects 25 and/or matrix material 26. Also, magnetic field 32 may be applied before and/or during any curing of matrix material 26 and/or objects 25. Moreover, it is not necessary to cure matrix material 26. For example, matrix material 26 may be water or some other liquid. Such liquid may also be removed in situ with etching layer 24. By in situ, it is meant within the same process chamber without having to break vacuum. Moreover, if hard mask layer 24 is to be etched in situ with removal of matrix material 26 (and possibly spacer objects 33), it will be necessary that appropriate materials are chosen for selectivity with respect to the etch chemistries employed. For example, if layer 24 is made of silicon oxide, matrix material 26 may be water and spacer objects 33 may be made of silicon oxide for use with an etch chemistry of $CF_4$, $CHF_3$, and He. However, matrix material 26 may comprise a material such as photoresist which can be removed by an ashing process (oxygen plasma etch).

Figure 8:
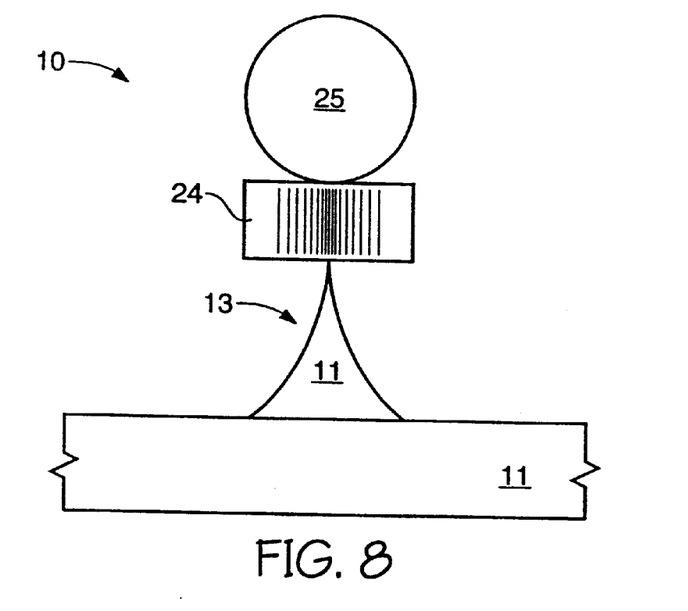
FIG. 8 is a cross-sectional view of an in-process emitter tip in accordance with the present invention.

Referring to FIG. 8, there is shown a cross-sectional view of an exemplary portion of FED 10 in accordance with the present invention. After alignment of masking objects 25, and removal of matrix material 26 (including any spacer objects 33) and of unprotected portions of mask layer 24 (portions not protected by masking objects 25), emitter tip 13 may be formed from layer 11 by any of a variety of known methods, including but not limited to an etch with controlled isotropy. Owing to the avoidance of agglomeration, the number of usable tips 13 is increased, and the uniformity of distribution of tips 13 is enhanced. Masking object 25 may be removed immediately after etching mask layer 24. In which case, emitter tip 13 is formed using remaining portions of mask layer 24 for defining emitter tip locations. Moreover, mask layer 24 may be omitted, as illustratively shown in FIG. 9.

Figure 9:
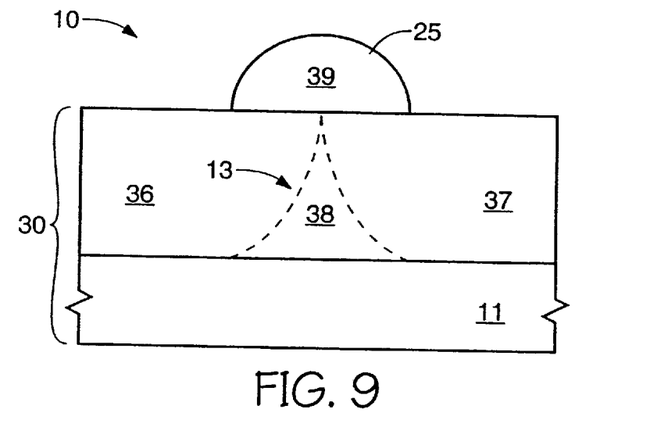
FIG. 9 is a cross-sectional view of a deformed masking object in accordance with the present invention.

Referring to FIG. 9, there is shown a cross-sectional view of substrate assembly 30 and masking object 39 in accordance with the present invention. Masking object 25 may be melted after application to form hemispherical or hemispherical-like shaped masking objects 39. After removal of matrix material 26 and deformation of object 25 (i.e., to form masking object 39), masking object 39 is in position for isotropic etch step 35. Etch step 35 is used to remove regions 36 and 37 of layer 11 which are unprotected by masking object 39, undercutting object 39 due to the isotropic nature of the etch. Region 38 remains after etch step 35 defining tip 13.

Figure 10:
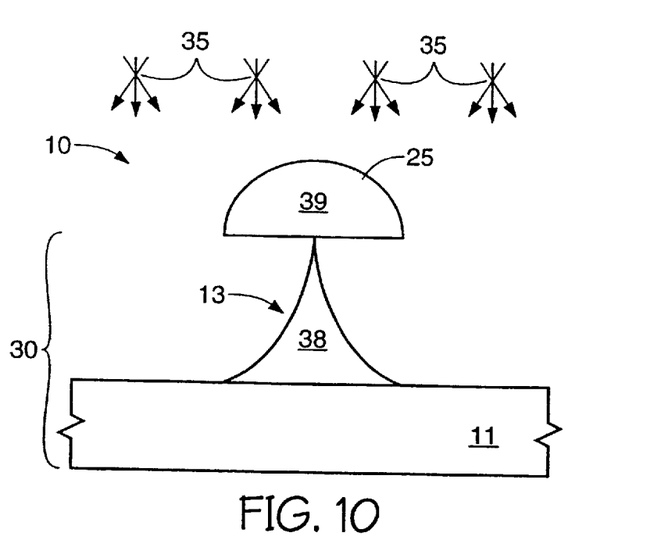
FIG. 10 is a cross-sectional view of a substrate assembly and a masking object during etching in accordance with the present invention.

Referring to FIG. 10, there is shown a cross-sectional view of substrate assembly 30 after etch step 35 of FIG. 9. As may be seen, portions 36 and 37 (shown in FIG. 9) have been removed. Masking object 39 may be removed in situ with etch 35 or thereafter.

Figure 11:
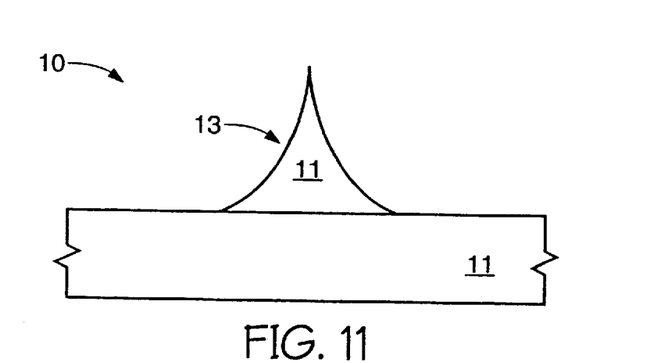
FIG. 11 is a cross-sectional view of an emitter tip formed in accordance with the present invention.

Referring to FIG. 11, there is shown a cross-sectional view of substrate assembly 30 in accordance with the present invention. Masking object 39 has been removed.

Referring to FIGS. 8–11 in combination, masking objects 25, 39 may be removed by etching, mechanical agitation (e.g., chemical mechanical polishing), and the like. In particular, depending on size and etch rate of masking objects 25, 39, etch step 35 may be non-selective to both masking objects 25, 39 and to regions 36 and 37 for in situ and simultaneous removal of them all. For example, suppose layer 11 is made of silicon, and an etch chemistry is employed which etches oxide at or about one-tenth as fast as it etches silicon. If oxide masking objects 25, 39 are one-tenth the thickness of layer 11, objects 25, 39 will be consumed as tips 13 are formed from layer 11 during etch step 35. A conventional silicon etch chemistry may be used for etch step 35.

Figure 12:
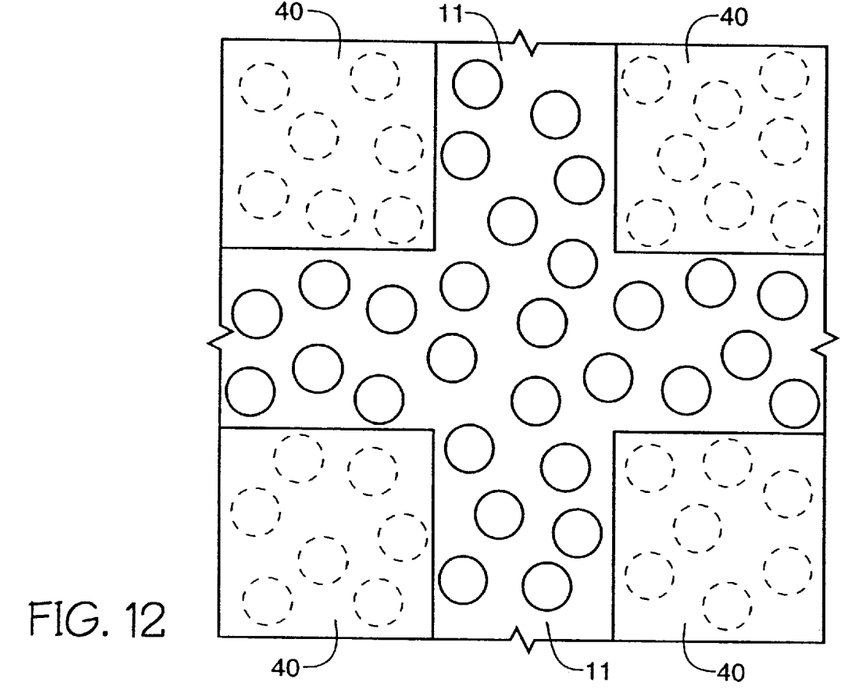
FIG. 12 is a top elevation view of an array of masked emitter tips in accordance with the present invention.

Referring to FIG. 12, a plurality of tips 13 may be formed on layer 11 as is illustratively shown in the top elevation view thereof. Covering ones of tips 13 is mask 40 in accordance with the present invention. Mask 40 protects underlying tips 13 from a subsequent etch to remove exposed tips 13. Mask 40 provides a pattern to delineate discrete sets of tips 13, where each set of tips 13 may correspond to a pixel of a display.

Figure 13:
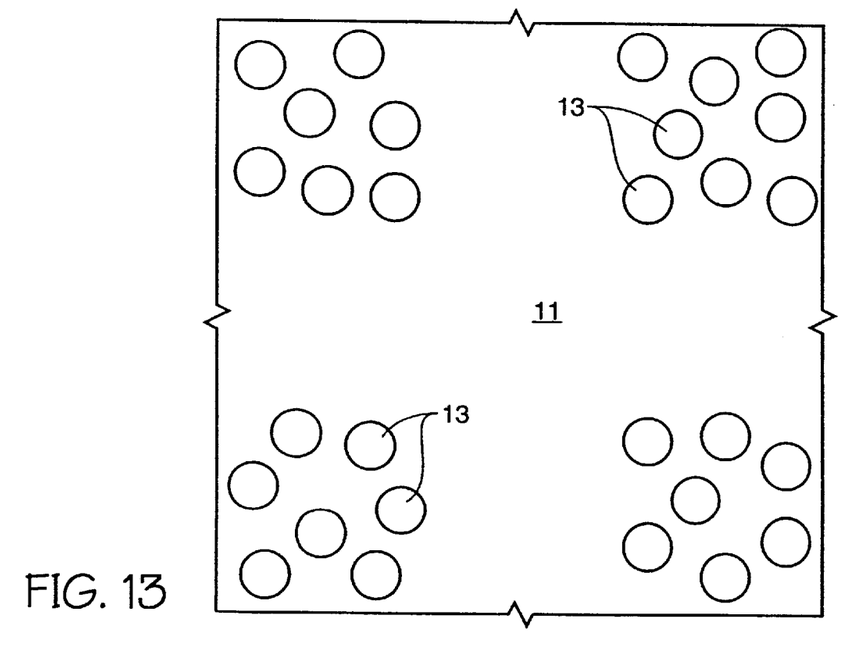
FIG. 13 is a top elevation view of the array of FIG. 12 after removal of selected emitter tips in accordance with the present invention.

Referring now to FIG. 13, there is shown a top elevation view of layer 11 after etching unwanted tips 13 with mask 40 in place. After mask 40 has been removed, as illustratively shown in FIG. 13, underlying tips 13 are exposed. In this manner, groups of tips 13 may be formed for providing pixels for FED 10 (shown in FIG. 1). The remainder of FED 10 may be formed in a known manner, such as described in U.S. Pat. 5,229,331 to Doan et al. which is incorporated by reference as though fully set forth herein.

The present invention may be employed in forming a variety of devices other than FEDs, such devices including but not limited to application specific integrated circuits, memories, microprocessors, microcontrollers, digital signal processors, and the like. Moreover, such devices in accordance with the present invention may be employed in various types of information handling systems, including but not limited to network cards, telephones, scanners, facsimile machines, routers, televisions, video recorders, copy machines, displays, printers, calculators, and personal computers, among other systems. The present invention has been particularly shown and described with respect to certain preferred embodiment(s) and features thereof. It should be readily apparent to those of ordinary skill in the art that various changes and modifications in form and detail may be made without departing from the spirit and scope of the present invention as set forth in the appended claims.

What is claimed is:

1. A process for providing a masking layer, comprising:
   providing a substrate assembly;
   dispensing a matrix material and a plurality of objects onto the substrate assembly;
   distributing the objects with a magnetic field; and
   removing at least a portion of the matrix material.

2. A process, as in claim 1, wherein dispensing comprises providing the matrix material in a liquid state.

3. A process, as in claim 2, further comprising curing the matrix material after distributing the objects.

4. A process, as in claim 3, wherein curing comprises altering the liquid state of the matrix material sufficiently to maintain the distribution of the objects.

5. A process, as in claim 3, wherein curing comprises forming a polymer form of the matrix material.

6. A process, as in claim 3, wherein curing comprises forming a solid form of the matrix material.

7. A process, as in claim 1, wherein dispensing comprises at least one of depositing, spraying, spreading, dipping, evaporating, and spinning the matrix material onto the substrate assembly.

8. A process, as in claim 1, wherein the objects include at least one of particles, microballs, droplets, and beads.

9. A process for providing an etch mask, comprising:
   providing a substrate assembly;
   dispensing matrix material and masking objects onto the substrate assembly, the matrix material being less magnetically permeable than the masking objects; and
   applying a magnetic field to the masking objects sufficient to relocate the objects.

10. A process, as in claim 9, wherein the matrix material includes at least one of an elastomer, an adhesive, a thermoplastic, and a glass.

11. A process, as in claim 9, wherein the matrix material is a liquid.

12. A process, as in claim 9, wherein the matrix material is a polymeric material.

13. A process, as in claim 12, wherein the polymeric material includes at least one of silicone rubber, epoxy, resin, and polyurethane.

14. A process, as in claim 9, further comprising curing the matrix material for at least one of solidification, gelation, and polymerization.

15. A process, as in claim 9, wherein the masking objects include ferromagnetic material.

16. A process, as in claim 9, wherein the masking objects are composed at least in part of a ferrite.

17. A process for providing an etch mask, comprising:
   providing a substrate assembly;
   dispensing a matrix material and masking objects onto the substrate assembly, the matrix material being more magnetically permeable than the masking objects; and
   applying a magnetic field to the matrix material sufficient to disperse the masking objects.

18. A process, as in claim 17, wherein the masking objects are composed at least in part of silica.

19. A process, as in claim 17, wherein the masking objects are composed at least in part of latex.

20. A process, as in claim 17, wherein the matrix material is a ferromagnetic liquid.

21. A process, as in claim 20, wherein the masking objects are composed at least in part of magnetite.

22. A process for forming an etch mask, comprising:
   providing a substrate assembly;
   dispensing masking objects on the substrate assembly;
   dispensing a matrix material on the substrate assembly; and
   applying a magnetic field to disperse the masking objects within the matrix material.

23. A process, as in claim 22, wherein some of the masking objects and the matrix material are dispensed simultaneously.

24. A process, as in claim 22, wherein the masking objects are dispensed prior to dispensing the matrix material.

25. A process, as in claim 22, wherein the step of dispensing the matrix material is done prior to the step of dispensing the masking objects.

26. A process, as in claim 22, further comprising, prior to dispensing of the masking objects and the matrix material, mixing the matrix material and the masking objects to form a suspension.

27. A process for forming an etch mask, comprising:
   dispensing masking objects on a substrate assembly, at least some of the masking objects forming a number of clusters; and
   applying a magnetic field to the masking objects to reduce the number of clusters thereof.

28. A process, as in claim 27, wherein applying the magnetic field comprises aligning magnetic poles of the masking objects to provide anisotropically conductive orientations thereof.

29. A process, as in claim 27, wherein applying the magnetic field comprises providing a blanket magnetic field.

30. A process, as in claim 27, wherein the magnetic field is a applied using a grid.

31. A process, as in claim 27, wherein applying is effected using permanent magnets.

32. A process, as in claim 27, wherein applying is effected using electromagnets.

33. A process for providing a mask on a surface of a substrate assembly, comprising:

locating spacer objects on the surface of the substrate assembly;

locating masking objects on the surface of the substrate assembly; and applying a magnetic field to the spacer objects and the masking objects located on the surface of the substrate assembly to alter a distribution thereof.

34. The process of claim 33, wherein the spacer objects are less magnetically conductive than the masking objects.

35. The process of claim 33, further comprising dispensing a matrix material over the surface to suspend the masking objects and the spacer objects thereabove.

36. The process of claim 33, further comprising dispensing a matrix material over the surface to restrict movement of the masking objects and the spacer objects thereover.

37. The process of claim 33, further comprising dispensing a matrix material to enhance movement of the masking objects and the spacer objects.

* * * * *